US012679733B2

(12) United States Patent
Matsuo

(10) Patent No.: US 12,679,733 B2
(45) Date of Patent: Jul. 14, 2026

(54) FULLERENE DERIVATIVE, FULLERENE DERIVATIVE PRODUCTION METHOD, DEPOSIT, FILM, AND ELECTRONIC DEVICE

(71) Applicants: NATIONAL UNIVERSITY CORPORATION TOKAI NATIONAL HIGHER EDUCATION AND RESEARCH SYSTEM, Aichi (JP); MITSUBISHI CORPORATION, Tokyo (JP)

(72) Inventor: Yutaka Matsuo, Aichi (JP)

(73) Assignees: NATIONAL UNIVERSITY CORPORATION TOKAI NATIONAL HIGHER EDUCATION AND RESEARCH SYSTEM, Nagoya (JP); MITSUBISHI CORPORATION, Tokyo (JP)

( * ) Notice: Subject to any disclaimer, the term of this patent is extended or adjusted under 35 U.S.C. 154(b) by 956 days.

(21) Appl. No.: 17/795,161

(22) PCT Filed: Jan. 22, 2021

(86) PCT No.: PCT/JP2021/002257
§ 371 (c)(1),
(2) Date: Jul. 25, 2022

(87) PCT Pub. No.: WO2021/149801
PCT Pub. Date: Jul. 29, 2021

(65) Prior Publication Data

US 2023/0099136 A1 Mar. 30, 2023

(30) Foreign Application Priority Data

Jan. 23, 2020 (JP) ................................ 2020-009133

(51) Int. Cl.
*C01B 32/156* (2017.01)
*C01B 32/152* (2017.01)
(Continued)

(52) U.S. Cl.
CPC .......... *C01B 32/156* (2017.08); *C01B 32/152* (2017.08); *H10K 50/16* (2023.02);
(Continued)

(58) Field of Classification Search
CPC .... C01B 32/156; C01B 32/152; H10K 50/16; H10K 85/211; H10K 85/50; H10K 30/50;
(Continued)

(56) References Cited

U.S. PATENT DOCUMENTS

2015/0136233 A1 5/2015 Wang et al.

FOREIGN PATENT DOCUMENTS

CN 102391078 A 3/2012
CN 103086890 A 5/2013
(Continued)

OTHER PUBLICATIONS

Niu et al. (A retro Baeyer-Villiger reaction: electrochemical reduction of [60]fullerene-fused lactones to [60]fullerene-fused ketones, Chemical Science, 2019) (Year: 2019).*
(Continued)

*Primary Examiner* — Daniel C. Mccracken
*Assistant Examiner* — Logan Laclair
(74) *Attorney, Agent, or Firm* — MUNCY, GEISSLER, OLDS & LOWE, P.C.

(57) ABSTRACT

A fullerene derivative has a structure of formula (1) or formula (2): wherein Ar is a substituted or unsubstituted aromatic ring, * is a carbon atom at the point of attachment to a fullerene core, X is O, S, Se, or Te, and R is an organic group.

(Continued)

1

(1)

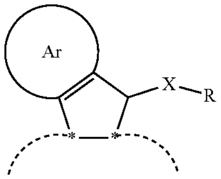

(2)

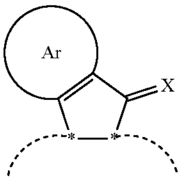

5 Claims, 7 Drawing Sheets

(51) Int. Cl.
*H10K 30/50* (2023.01)
*H10K 50/16* (2023.01)
*H10K 85/20* (2023.01)
*H10K 85/50* (2023.01)

(52) U.S. Cl.
CPC .......... *H10K 85/211* (2023.02); *H10K 85/50* (2023.02); *H10K 30/50* (2023.02)

(58) Field of Classification Search
CPC .. H10K 50/155; H10K 85/215; Y02E 10/549; C07C 43/188; C07C 43/21; C07C 43/243; C07C 45/27; C07C 49/665; C07C 49/753; C07C 43/18; C07C 41/09; C07C 45/29; C07C 2604/00; C07D 333/78
See application file for complete search history.

(56) References Cited

FOREIGN PATENT DOCUMENTS

| | | | |
|---|---|---|---|
| CN | 105209433 | A | 12/2015 |
| CN | 106380380 | A | 2/2017 |
| CN | 110343064 | A | 10/2019 |
| JP | 2014181238 | A | 9/2014 |
| JP | 2015153767 | A | 8/2015 |
| JP | 2017057266 | A | 3/2017 |
| JP | 2017519771 | A | 7/2017 |
| JP | 2017528914 | A | 9/2017 |
| JP | 2019099570 | A | 6/2019 |

OTHER PUBLICATIONS

Lin et al. (Highly Selective and Scalable Fullerene-Cation-Mediated Synthesis Accessing Cyclo[60]fullerenes with Five-Membered Carbon Ring and Their Application to Perovskite Solar Cells, Chemistry of Materials, 2019) (Year: 2019).*

Mi et al. (Fullerene Derivatives as Electron Acceptors for Organic Photovoltaic Cells, Journal of Nanoscience and Nanotechnology, 2014) (Year: 2014).*

Office Action dated May 25, 2024, issued in counterpart Chinese Patent Application No. 202180010773.6 (with English translation) (15 pages).

Office Action for JP Application No. 2024-049083 dated Nov. 19, 2024 is attached (5 pgs.).

An Office Action in corresponding KR Application No. 10-2022-7026694 dated Apr. 9, 2025, 7 pages.

Office Action dated May 4, 2024, issued in counterpart Japanese Patent Application No. 2021-572817 (with English translation) (4 pages).

An Office Action in corresponding CN Application No. 202180010773.6 dated Aug. 3, 2024.

An Office Action in corresponding KR Application No. 10-2022-7026694 dated Aug. 7, 2024.

Niu et al., *A retro Baeyer-Villiger reaction: electrochemical reduction of [60]fullerene-fused lactones to [60]fullerene-fused ketones*. Chem Sci. Jan. 16, 2019;10(10):3012-3017. doi: 10.1039/c8sc05089a.

JP Office Action issued for corresponding Japanese Patent Application No. 2021-572817 dated Aug. 15, 2023.

Office Action issued for corresponding Korean Patent Application No. 10-2022-7026694 dated Jan. 8, 2026.

Hao-Sheng Lin et al, “Highly Selective and Scalable Fullerene-Cation-Mediated Synthesis Accessing Cyclo [60] fullerenes with Five-Membered Carbon Ring and Their Application to Perovskite Solar Cells”, Chemistry of Materials, 2019 American Chemical Society, pp. 8432-8439, Published Sep. 11, 2019, vol. 31(20).

Chuang Niu et al, “A retro Baeyer-Villiger reaction: electrochemical reduction of [60] fullerene-fused lactones to [60] fullerene-fused ketones”, Chem Sci. 2019, vol. 10(10), 3012-3017, The Royal Society of Chemistry 2019 Journal.

Tian, Weiquan et al, “Theoretical study on the double cages carbonyl compound C120C0”, Gaodeng Xuexia Huaxue Xuebao, 1998, vol. 19(12), pp. 1982-1986.

Beer, Ernst et al, “Fuctionalization of buckminsterfullerene C60 vai [8+2]-cycloaddition: spectroscopic and electron-transfer properties of tetrahydroazulenofullerenes”, Angewandte Chemie International Edition, 1994, vol. 33(10), pp. 1087-1089.

International Search Report: PCT/JP2021/002257, 6 pages.

IPRP PCT/JP2021/002257, 12 pages.

Office Action issued for corresponding Japanese Patent Application No. 2021-572817 dated Dec. 2, 2025.

* cited by examiner

FULLERENE DERIVATIVE, FULLERENE DERIVATIVE PRODUCTION METHOD, DEPOSIT, FILM, AND ELECTRONIC DEVICE

TECHNICAL FIELD

The present disclosure relates to a fullerene derivative, and particularly relates to a fullerene derivative, a method for producing a fullerene derivative, a deposit containing a fullerene derivative, a film, and an electronic device.

BACKGROUND ART

Organic electronic devices using an organic substance are used. In an electronic device such as a semiconductor, it is almost essential to form a material into a thin film. Examples of a method for forming an organic substance into a thin film include vacuum deposition, solution coating, and the like. Solution coating is low in cost, but generally has lower product reliability than vacuum deposition. Therefore, under the present circumstances, vacuum deposition capable of more reliably producing highly reliable products is generally adopted.

Fullerene ($C_{60}$) attracts attention as a rare organic substance that can be used as an electron acceptor or an electron transport material (see, for example, Patent Literature 1). By introducing various substituents into fullerene, it is expected to develop a fullerene derivative having suitable characteristics suitable for purposes, specifications, and the like.

CITATION LIST

Patent Literature

[Patent Literature 1] JP 2019-99570 A

SUMMARY OF INVENTION

Technical Problem

However, fullerene itself can be formed into a film by vacuum deposition or solution coating. However, in general, fullerene derivatives can be formed into a film only by solution coating because most of fullerene derivatives are thermally decomposed by vacuum deposition.

The present disclosure has been made in view of such a problem, and an object of the present disclosure is to provide a fullerene derivative having excellent characteristics.

Solution to Problem

In order to solve the above problem, one aspect of the present disclosure is a fullerene derivative. This fullerene derivative has a structure of formula (1):

[Chem. 1]

(1)

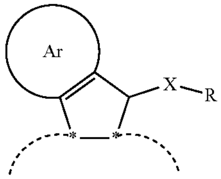

wherein Ar is a substituted or unsubstituted aromatic ring, * is a carbon atom at the point of attachment to a fullerene core, X is O, S, Se, or Te, and R is an organic group.

Another aspect of the present disclosure is a method for producing a fullerene derivative. This method is a method for producing a fullerene derivative having a structure of formula (1) and includes a first step of preparing a Grignard reagent by reaction of an aryl halide with magnesium; a second step of synthesizing an arylhydrofullerene by reaction of the Grignard reagent and fullerene; a third step of synthesizing an aryl fullerene dimer by oxidizing the arylhydrofullerene in the presence of a base; and a fourth step of synthesizing a fullerene derivative having a structure of formula (1) by oxidizing the aryl fullerene dimer.

Still another aspect of the present disclosure is a fullerene derivative. This fullerene derivative has a structure of formula (2):

[Chem. 2]

(2)

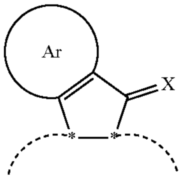

wherein Ar is an aromatic ring, * is a carbon atom at the point of attachment to a fullerene core, and X is O, S, Se, or Te.

Still another aspect of the present disclosure is a method for producing a fullerene derivative. This method is a method for producing a fullerene derivative having a structure of formula (2), and includes a step of oxidizing the fullerene derivative having a structure of formula (1).

Still another aspect of the present disclosure is a method for producing a deposit. This method includes a step of heating the fullerene derivative having a structure of formula (1) or formula (2) to a temperature equal to or higher than the sublimation temperature to deposit the fullerene derivative.

Yet another aspect of the present disclosure is a film. This film contains a fullerene derivative having a structure of formula (1) or formula (2).

Yet another aspect of the present disclosure is an electron transport material. This electron transport material contains a fullerene derivative having a structure of formula (1) or formula (2).

Yet another aspect of the present disclosure is an electronic device. This electronic device contains the film or the electron transport material.

Advantageous Effects of Invention

According to the present disclosure, a fullerene derivative having excellent characteristics can be provided.

DESCRIPTION OF EMBODIMENTS

Figure 1:
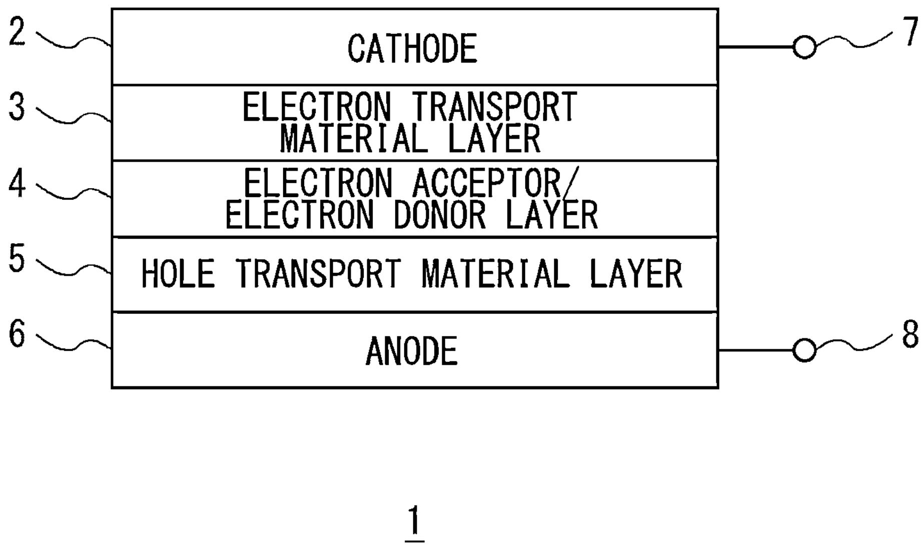
FIG. 1 is a diagram schematically showing a configuration of an organic solar cell according to an embodiment.

As embodiments of the present disclosure, a fullerene derivative that can be deposited and a fullerene derivative as a precursor thereof are disclosed. For details of the synthesis method and electrical physical properties of the fullerene derivative as a precursor, refer to the paper ("Highly Selective and Scalable Fullerene-Cation-Mediated Synthesis Accessing Cyclo[60]fullerenes with Five-Membered Carbon Ring and Their Application to Perovskite Solar Cells", Hao-Sheng Lin, Il Jeon, Yingqian Chen, Xiao-Yu Yang, Takafumi Nakagawa, Shigeo Maruyama, Sergei Manzhos, Yutaka Matsuo, Chemistry of Materials, 2019, 31, 20, 8432-8439, published on Sep. 11, 2019) published by the present inventors.

The fullerene derivative of the present disclosure has a structure of formula (1). The fullerene derivative having a structure of formula (1) is a precursor of a fullerene derivative having a structure of formula (2) described later, but the fullerene derivative having a structure of formula (1) itself also has excellent characteristics, and can be used as an electron acceptor or an electron transport material of an organic semiconductor or the like.

[Chem. 3]

(1)

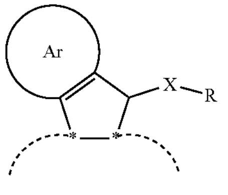

Here, Ar is any aromatic ring. Ar may be, for example, a benzene ring, a fused ring such as naphthalene, anthracene, phenanthrene, or pyrene, a heterocyclic ring such as furan, thiophene, pyrrole, pyrazole, imidazole, pyridine, pyridazine, pyrimidine, or pyrazine, or the like. Ar may have any substituent such as an alkyl group, a heteroalkyl group, an alkenyl group, a heteroalkenyl group, an alkynyl group, a heteroalkynyl group, a cycloalkyl group, a heterocycloalkyl group, an aryl group, a heteroaryl group, an alkoxy group, a carbonyl group, a carboxy group, a cyano group, a hydroxy group, a thiol group, an amino group, an imino group, a nitro group, or a halogen, or may have no substituent.

* is a carbon atom at the point of attachment to a fullerene core. The fullerene core may be, for example, $C_{60}$, $C_{70}$, $C_{72}$, $C_{74}$, $C_{76}$, $C_{78}$, $C_{80}$, $C_{82}$, $C_{84}$, $C_{86}$, $C_{88}$, $C_{90}$, or the like.

X is O, S, Se, or Te. X may be C, N, P, or the like.

R is any organic group. R may be, for example, an alkyl group, a heteroalkyl group, an alkenyl group, a heteroalkenyl group, an alkynyl group, a heteroalkynyl group, a cycloalkyl group, a heterocycloalkyl group, an aryl group, a heteroaryl group, an alkoxy group, a carbonyl group, an imino group, a combination thereof, or the like.

A method for producing a fullerene derivative having a structure of formula (1) includes a first step of preparing a Grignard reagent by reaction of an aryl halide with magnesium; a second step of synthesizing an arylhydrofullerene by reaction of the Grignard reagent and fullerene; a third step of synthesizing an aryl fullerene dimer by oxidizing the arylhydrofullerene in the presence of a base; and a fourth step of synthesizing a fullerene derivative having a structure of formula (1) by oxidizing the aryl fullerene dimer.

In the second step, a solvent containing an organic substance having a planar structure such as 1,3-dimethyl-2-imidazolidinone (DMI) as a co-solvent may be used. This makes it possible to produce arylhydrofullerene with high selectivity.

In the third step, a strong base with low nucleophilicity may be used as a base, such as a metal alkoxide such as potassium tert-butoxide (t-BuOK), or a metal amide such as lithium diisopropylamide (LDA), potassium hexamethyldisilazide (KHMDS), or lithium-2,2,6,6-tetramethylpiperidide (LiTMP). Also, as an oxidant, N-bromosuccinimide (NBS) may be used.

In the fourth step, $CuBr_2$ may be used as an oxidant. In the fourth step, the aryl fullerene dimer may be heated in the presence of an oxidant. The heating temperature may be, for example, 100° C., and the heating time may be, for example, 3 hours.

In each step, the product may be isolated and purified before proceeding to the next step, or the product may proceed to the next step without isolation or purification. For example, a fullerene derivative having a structure of formula (1) may be synthesized by proceeding to the fourth step without isolating the aryl fullerene dimer generated in the third step, and directly adding an oxidant and heating the mixture.

The fullerene derivative that can be deposited of the present disclosure has a structure of formula (2).

[Chem. 4]

(2)

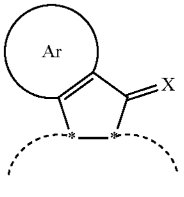

Here, Ar is any aromatic ring. Ar may be, for example, a benzene ring, a fused ring such as naphthalene, anthracene, phenanthrene, or pyrene, a heterocyclic ring such as furan, thiophene, pyrrole, pyrazole, imidazole, pyridine, pyridazine, pyrimidine, or pyrazine, or the like. Ar may have any substituent such as an alkyl group, a heteroalkyl group, an alkenyl group, a heteroalkenyl group, an alkynyl group, a heteroalkynyl group, a cycloalkyl group, a heterocycloalkyl group, an aryl group, a heteroaryl group, an alkoxy group, a carbonyl group, a carboxy group, a cyano group, a hydroxy group, a thiol group, an amino group, an imino group, a nitro group, or a halogen, or may have no substituent.

* is a carbon atom at the point of attachment to a fullerene core. The fullerene core may be $C_{60}$, $C_{70}$, $C_{72}$, $C_{74}$, $C_{76}$, $C_{78}$, $C_{80}$, $C_{82}$, $C_{84}$, $C_{86}$, $C_{88}$, $C_{90}$, or the like.

X is O, S, Se, or Te. X may be C, N, P, or the like.

A method for producing a fullerene derivative having a structure of formula (2) includes a step of oxidizing the fullerene derivative of formula (1). In the oxidizing step, $CuBr_2$ may be used as an oxidant. In the oxidizing step, the fullerene derivative of formula (1) may be heated in the presence or absence of an oxidant. The heating temperature may be, for example, 80 to 130° C., and the heating time may be, for example, 1 to 6 hours. Also, the heating temperature may be a temperature equal to or higher than the sublimation temperature of the fullerene derivative of formula (1).

[Chem. 5]

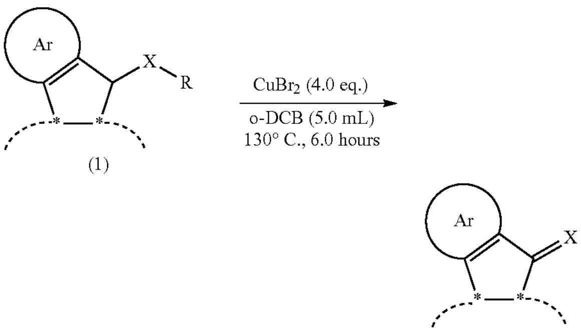

(1)

(2)

Since both the fourth step of the method for producing a fullerene derivative of formula (1) and the step of the method for producing a fullerene derivative of formula (2) are oxidation reactions, these steps may be continuously performed. For example, after $CuBr_2$ is added to the aryl fullerene dimer as an oxidant and heated at 100° C. for 3 hours to synthesize the fullerene derivative of formula (1), the fullerene derivative of formula (2) may be synthesized by further heating at 130° C. for 6 hours without isolating the fullerene derivative of formula (1). The heating temperature in the step of synthesizing the fullerene derivative of formula (2) may be higher than the heating temperature in the step of synthesizing the fullerene derivative of formula (1). In addition, the heating time in the step of synthesizing the fullerene derivative of formula (2) may be longer than the heating time in the step of synthesizing the fullerene derivative of formula (1). The heating temperature in the case of synthesizing the fullerene derivative of formula (2) after isolating and purifying the fullerene derivative of formula (1) may be lower than the heating temperature in the case of synthesizing the fullerene derivative of formula (2) without isolating and purifying the fullerene derivative of formula (1), and may be, for example, 100° C. The heating time in the case of synthesizing the fullerene derivative of formula (2) after isolating and purifying the fullerene derivative of formula (1) may be shorter than the heating time in the case of synthesizing the fullerene derivative of formula (2) without isolating and purifying the fullerene derivative of formula (1), and may be, for example, 3 hours.

As shown in the following examples, the fullerene derivative having a structure of formula (2) can be deposited with little decomposition. In general, when a fullerene derivative is deposited, many fullerene derivatives are thermally decomposed, and a decomposition product such as a fullerene core is deposited. The fullerene derivative of formula (2) has a structure in which a stable carbon five-membered ring is bonded to a fullerene core, and a C—H bond which is a relatively weak bond that is easily decomposed does not exist in the carbon five-membered ring. Therefore, it is considered that the fullerene derivative of formula (2) can be deposited without being thermally decomposed even when heated to a temperature equal to or higher than the sublimation temperature.

As shown in the following examples, when the fullerene derivative having a structure of formula (1) is deposited, a part thereof is thermally decomposed into a fullerene core or the like, but a part thereof is converted into a fullerene derivative having a structure of formula (2) and deposited. Therefore, also by depositing the fullerene derivative having a structure of formula (1), a deposit containing a fullerene derivative having a structure of formula (2) can be produced.

A method for producing a deposit containing a fullerene derivative of the present disclosure includes a step of heating a fullerene derivative having a structure of formula (2) to a temperature equal to or higher than the sublimation temperature to deposit the fullerene derivative. This makes it possible to efficiently produce a high-purity deposit of a fullerene derivative having excellent characteristics.

A method for producing a deposit containing a fullerene derivative of the present disclosure includes a step of heating a fullerene derivative having a structure of formula (1) to a temperature equal to or higher than the sublimation temperature to deposit the fullerene derivative. This makes it possible to efficiently produce a deposit containing a fullerene derivative having excellent characteristics.

The film of the present disclosure contains a fullerene derivative having a structure of formula (1) or formula (2). This film may be produced by any film forming technique such as vacuum deposition or solution coating. This makes it possible to provide a thin film having excellent characteristics.

The electron transport material of the present disclosure contains a fullerene derivative having a structure of formula (1) or formula (2). This makes it possible to provide an electron transport material having excellent characteristics.

The electronic device of the present disclosure includes a film or an electron transport material containing a fullerene derivative having a structure of formula (1) or formula (2). The electronic device may be, for example, an organic semiconductor, an organic solar cell, or the like. This makes it possible to produce an electronic device having excellent characteristics with a high yield FIG. 1 schematically shows a configuration of an organic solar cell according to an embodiment. An organic solar cell 1 includes a cathode 2, an electron transport material layer 3, an electron acceptor/electron donor layer 4, a hole transport material layer 5, an anode 6, a cathode terminal 7, and an anode terminal 8. The cathode 2 and the anode 6 are formed of a metal, an alloy, an inorganic substance, an organic substance or the like having electrical conductivity. The electron transport material layer 3 is a thin film containing a fullerene derivative having a structure of formula (1) or formula (2). The electron acceptor/electron donor layer 4 is a layer of a mixture of an electron acceptor and an electron donor. The hole transport material layer 5 is a thin film containing any hole transport material. These thin films may be formed by solution coating or may be formed by deposition. In the case of solution coating, a film may be formed by coating a transparent electrode substrate such as indium tin oxide (ITO) with a solution in which a fullerene derivative having a structure of formula (1) or formula (2) functioning as an electron acceptor molecule and an electron donor molecule are mixed. In the case of deposition, a film may be formed by separately depositing a fullerene derivative having a structure of formula (1) or formula (2) and an electron donor molecule on a transparent electrode substrate, or may be formed by co-deposition. The cathode 2 is formed on the substrate thus prepared by deposition or the like, and the cathode terminal 7 is connected to the cathode 2 and the anode terminal 8 is connected to the anode 6, whereby the organic solar cell 1 is produced.

When light such as sunlight strikes the organic solar cell 1, mainly electron donor molecules absorb the light and are excited, and excitons are generated. The generated excitons move to the electron acceptor/electron donor layer 4, and electrons flow from the electron donor molecule to the electron acceptor molecule in the electron acceptor/electron donor layer 4 to form a charge separation state. That is, the electron donor molecule passes an electron to the electron acceptor molecule and becomes a cation (hole), and the electron acceptor molecule receives an electron and becomes an anion. When holes flow to the anode 6 in the hole transport material layer 5 and electrons flow to the cathode 2 in the electron transport material layer 3, a current flows to an external circuit via the cathode terminal 7 and the anode terminal 8.

EXAMPLES

As examples of the present disclosure, fullerene derivatives (1a) to (1e) having a structure of formula (1) and fullerene derivatives (2a) to (2e) having a structure of formula (2) were synthesized. Unless stated otherwise, all reactions were performed with a dry solvent in a heat-dried glass product under an argon atmosphere with standard vacuum-line techniques.

[Chem. 6]

(1a)

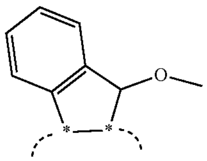

(1b)

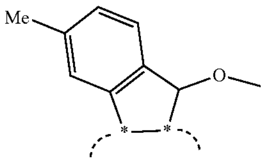

(1c)

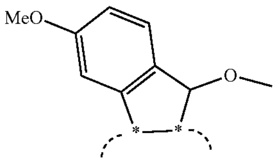

-continued (1d)

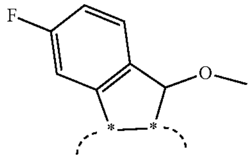

(1e)

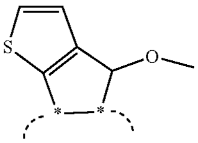

[Chem. 7]

(2a)

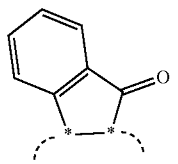

(2b)

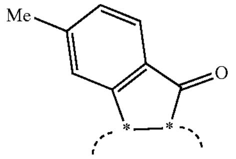

(2c)

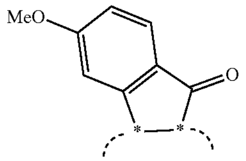

(2d)

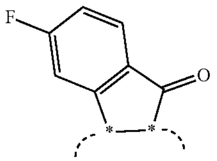

(2e)

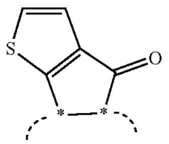

Synthesis of Aryl Bromide

Methanol (20.0 mL) was slowly added to sodium (517.5 mg, 22.5 mmol) at 0° C. After complete reaction of sodium with methanol, benzyl bromide (15 mmol) with various functional groups was added to the reaction solution and left at room temperature for 5 hours. Subsequently, the reaction suspension was quenched with 10 mL of water and extracted with dichloromethane (10×3 mL). The organic layer was dried over magnesium sulfate, and the solvent was removed under reduced pressure to obtain a crude product. Purification on a silica gel column with n-hexane/ethyl acetate (10/1, v/v) as eluent afforded a colorless oily product.

First Step: Synthesis of Grignard Reagent

A solution of aryl bromide (10 mmol) in anhydrous tetrahydrofuran (THF) (10.0 mL) was slowly added drop-wise to polished magnesium powder (360.0 mg, 15 mmol) using a trace amount of iodine as an initiator, at 0° C. under an argon atmosphere. After vigorous stirring for 1 hour, the adjusted Grignard solution was transferred by Schlenk operation and stocked in a Schlenk bottle. Before use, the concentration was confirmed by anhydrous titration using a trace amount of 1,10-phenanthroline as an indicator and menthol as a titrant under an argon atmosphere.

Second Step: Synthesis of Arylhydrofullerene ($ArC_{60}H$)

$C_{60}$ (300.0 mg, 0.417 mmol) was dissolved in anhydrous o-dichlorobenzene (o-DCB) (50.0 mL) containing 1,3-dimethyl-2-imidazolidinone (DMI) (1.4 mL, 12.5 mmol) as a co-solvent. Subsequently, the Grignard reagent synthesized above was added to the solution at 25° C. under an argon atmosphere. After stirring for 15 min, acetic acid (0.1 mL, 1.75 mmol) was added to quench the reaction and the solvent was evaporated in vacuo. The residue was dissolved in $CS_2$ and purified on a silica gel column using $CS_2$/dichloromethane as eluent to obtain a product.

Third Step: Synthesis of Aryl Fullerene Dimer ($ArC_{60}$-$C_{60}Ar$)

The monoadduct (0.048 mmol) synthesized in the second step was dissolved in 5.0 mL of anhydrous o-DCB solution. Subsequently, a THF solution of t-BuOK (58 μL, 0.058 mmol, 1 M) was added, and the mixture was strongly stirred at room temperature for 15 minutes under an argon atmosphere. Then, N-bromosuccinimide (NBS) (34.2 mg, 0.192 mmol) was added. The reaction mixture was stirred vigorously at room temperature for 12 hours under an argon atmosphere. Subsequently, the resulting brown suspension was quenched with 1.0 mL of water and an excess amount of methanol was added to precipitate a product. Finally, an aryl[60]fullerene dimer was recovered as a residue by filtration without the need for further purification.

Fourth Step: Synthesis of Fullerene Derivatives of Formula (1)

0.030 mmol of the aryl[60]fullerene dimer was dissolved in 10.0 mL of anhydrous o-DCB solution containing $CuBr_2$ (26.8 mg, 0.120 mmol) as an oxidant. After vigorous stirring at 100° C. for 3 hours, the resulting mixture was directly filtered through a silica gel plug to remove insoluble salts, followed by evaporation in vacuo to remove the solvent. Next, the residue was purified on a silica gel column using $CS_2$ as eluent to obtain products. The yields of fullerene derivatives (1a) to (1d) were 93%, 90%, 86%, and 73%, respectively.

Synthesis of Fullerene Derivatives of Formula (2)

The fullerene derivatives of formula (1) were dissolved in 5.0 mL of anhydrous o-DCB solution containing $CuBr_2$ (4.0 eq.) as an oxidant. After vigorous stirring at 130° C. for 6 hours, the resulting mixture was purified to obtain products. The yields of fullerene derivatives (2a) to (2d) were 94%, 92%, 90%, and 82%, respectively.

Characteristics of Fullerene Derivatives

Figure 2A:
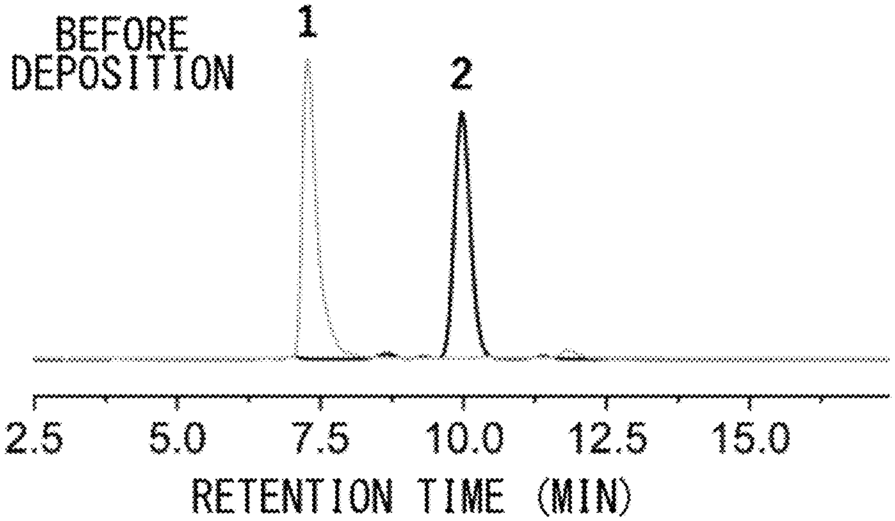
FIGS. 2(*a*) and 2(*b*) are diagrams showing results of vacuum deposition of fullerene derivatives according to embodiments.
Figure 2B:
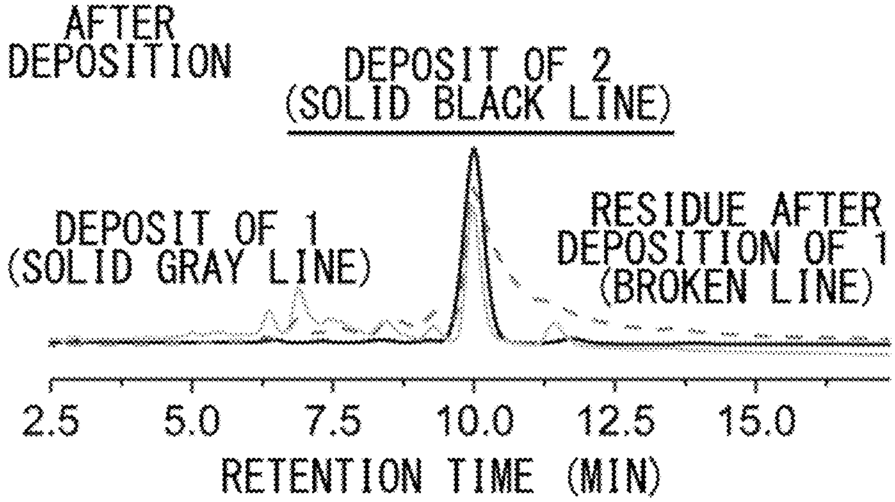

FIGS. 2(*a*) and (2*b*) show results of vacuum deposition of fullerene derivatives of formula (1) and formula (2). FIG. 2(*a*) is a high performance liquid chromatography (HPLC) chart of a deposition source before deposition. FIG. 2(*b*) is an HPLC chart of a deposit and a residue after deposition. The deposit on which the fullerene derivative of formula (2) was deposited shows the same peak as that of the fullerene derivative of formula (2) before deposition, and peaks derived from other substances are hardly observed. Therefore, it was shown that almost 100% of the fullerene derivative of formula (2) can be deposited without being thermally decomposed.

The deposit on which the fullerene derivative of formula (1) was deposited shows many peaks, but a large peak is also observed at the same position as that of the fullerene derivative of formula (2). In addition, a large peak is observed at the same position as that of the fullerene derivative of formula (2) in the residue after the fullerene derivative of formula (1) was deposited. Therefore, it was shown that the fullerene derivative of formula (2) is produced by heating the fullerene derivative of formula (1) to a temperature equal to or higher than the sublimation temperature, and that the deposit containing the fullerene derivative of formula (2) is produced by depositing the fullerene derivative of formula (1).

Figure 3A:
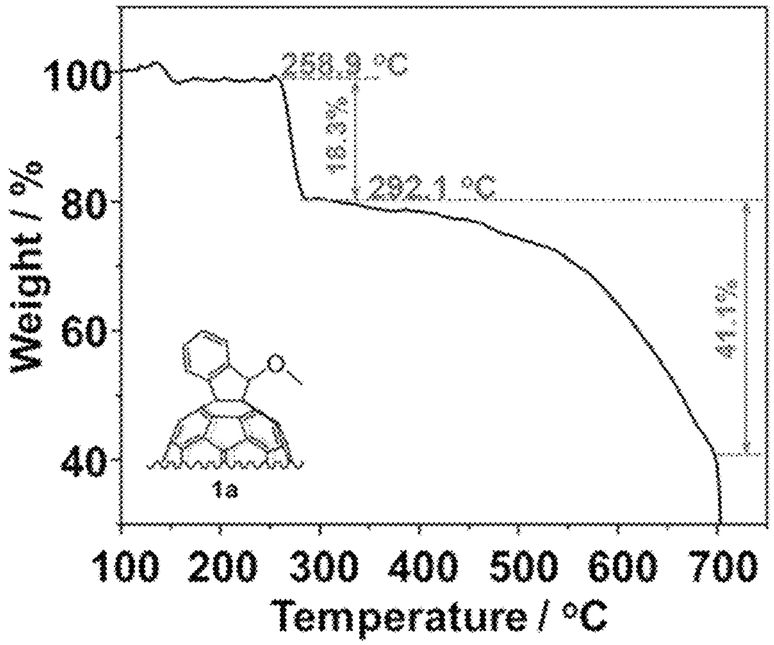
FIGS. 3(*a*) and 3(*b*) are diagrams showing results of thermogravimetric analysis of fullerene derivatives of formula (1a) and formula (2a), respectively.
Figure 3B:
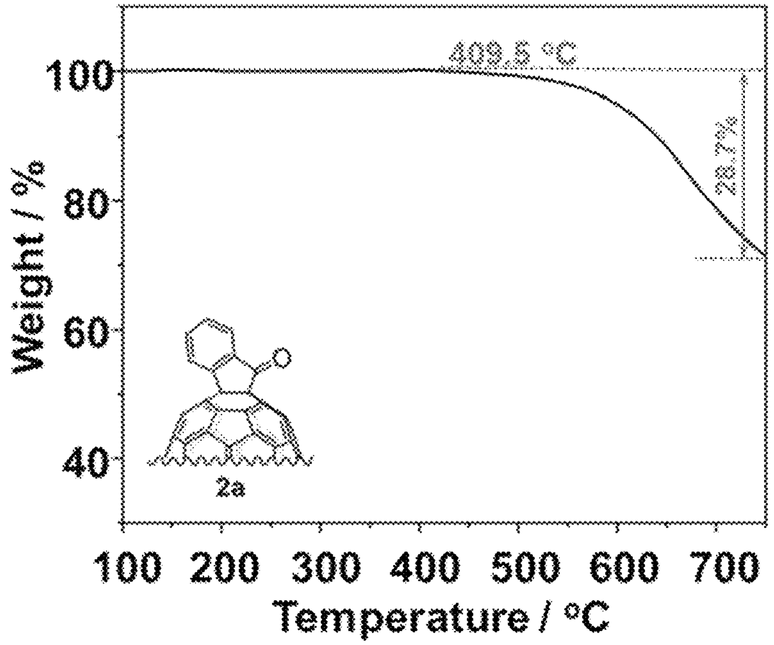

FIGS. 3(*a*) and 3(*b*) show results of thermogravimetric analysis of fullerene derivatives of formula (1a) and formula (2a), respectively. A sample was heated under a nitrogen stream, and the change in mass was measured. It has been found that the fullerene derivative of formula (1a) starts to decompose at around 250° C., but the fullerene derivative of formula (2a) is stable up to around 400° C.

Figure 4A:
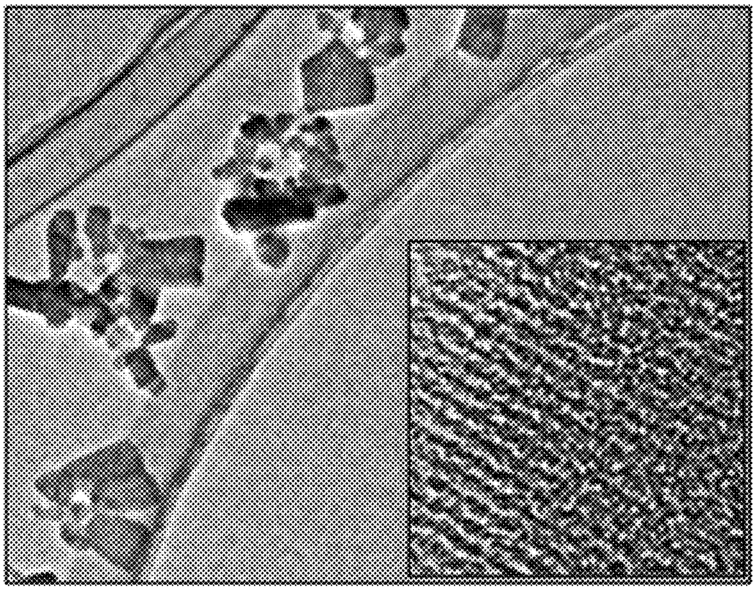
FIGS. 4(*a*) and 4(*b*) are electron micrographs of thin films of fullerene derivatives of formula (2a) formed by spin coating method and vacuum deposition method, respectively.
Figure 4B:
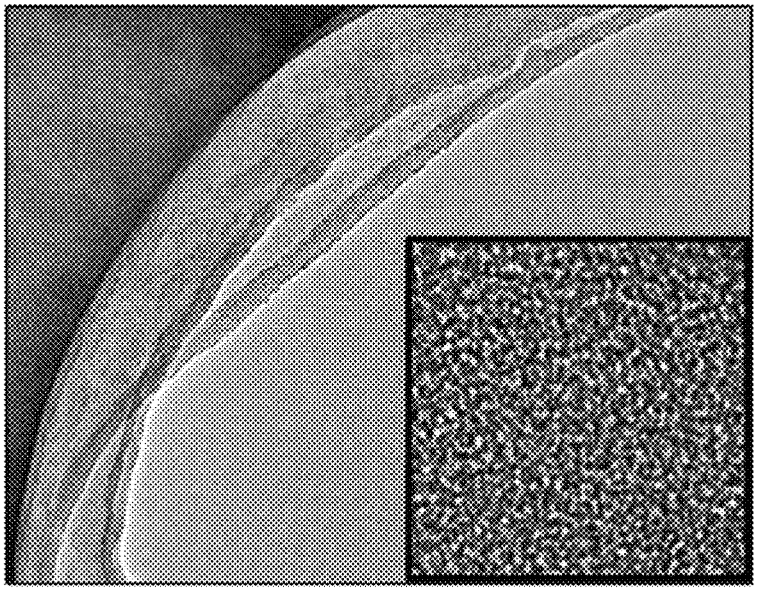

FIGS. 4(*a*) and 4(*b*) show electron micrographs of thin films of fullerene derivatives of formula (2a) formed by spin coating method and vacuum deposition method, respectively. The thin film formed by vacuum deposition method was a homogeneous amorphous thin film. The thin film formed by spin coating method was a crystalline thin film.

Figure 5A:
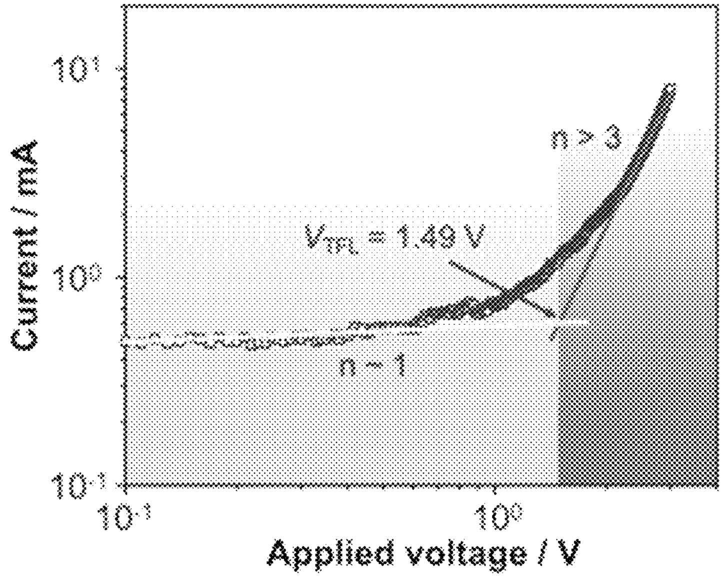
FIGS. 5(*a*) and 5(*b*) are diagrams showing current-voltage characteristics of fullerene derivatives of formula (2a) formed by spin coating method and vacuum deposition method, respectively.
Figure 5B:
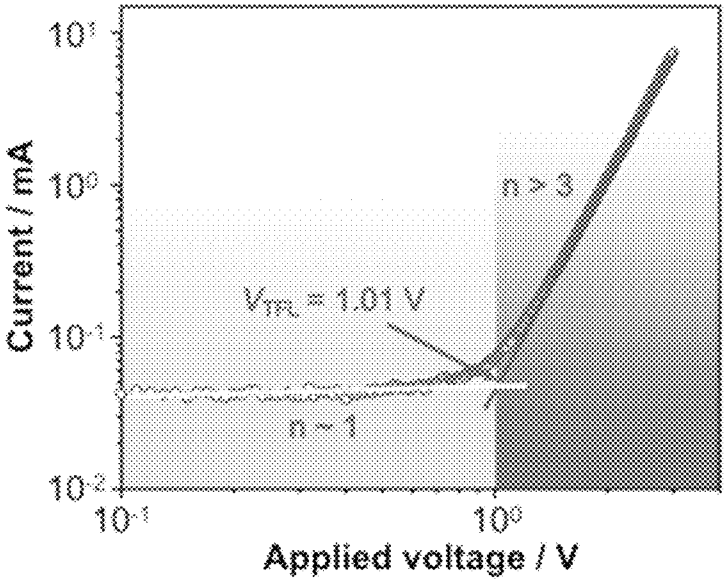

FIGS. 5(*a*) and 5(*b*) show current-voltage characteristics of fullerene derivatives of formula (2a) formed by spin coating method and vacuum deposition method, respectively. The thin film formed by vacuum deposition method had a smaller amount of charge trap than the thin film formed by spin coating method. As described above, by forming a film of the fullerene derivative of formula (2a) by vacuum deposition method, an organic thin film having better characteristics can be produced.

Figure 6A:
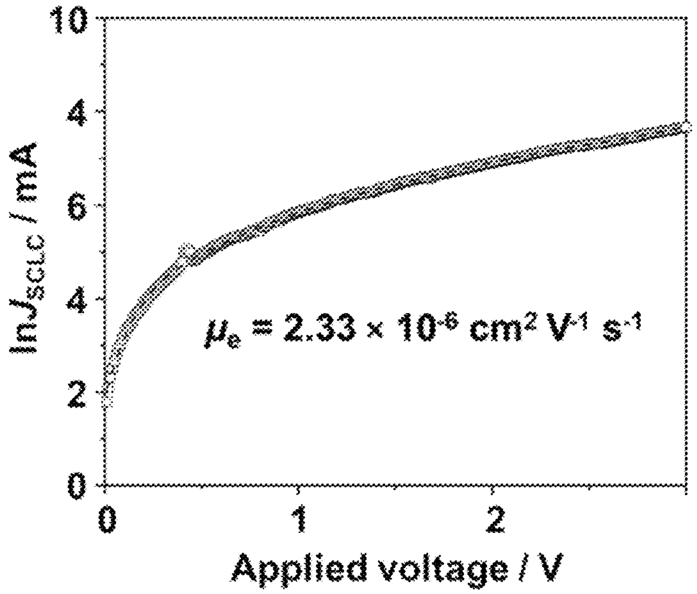
FIGS. 6(*a*) and 6(*b*) are diagrams showing electron mobilities of vacuum deposited films of fullerene derivatives of $C_{60}$ and formula (2a), respectively.
Figure 6B:
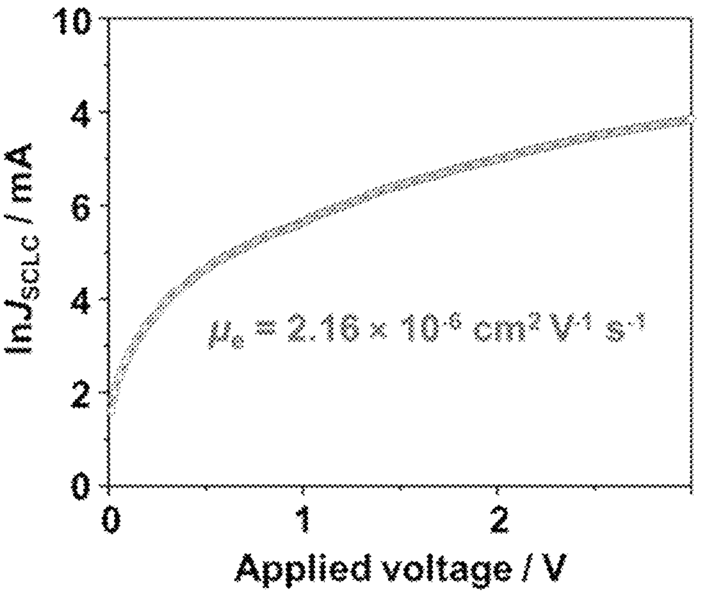

FIGS. 6(*a*) and 6(*b*) show electron mobilities of vacuum deposited films of fullerene derivatives of $C_{60}$ and formula (2a), respectively. The electron mobility of each vacuum deposited film was measured by space charge limited current (SCLC) method. The electron mobility of the vacuum deposited film of the fullerene derivative of formula (2a) was equivalent to the electron mobility of the vacuum deposited film of $C_{60}$.

Figure 7A:
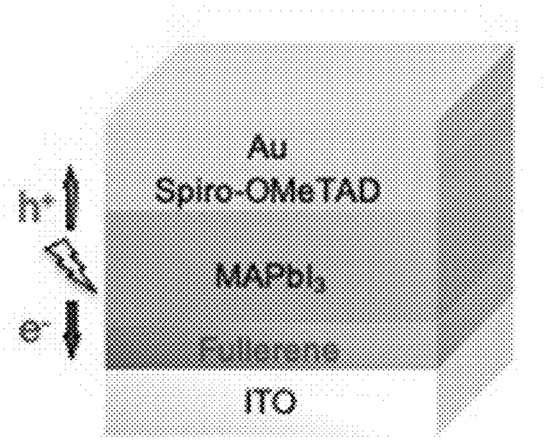
FIGS. 7(*a*), 7(*b*), and 7(*c*) are diagrams showing examples of organic solar cells.
Figure 7B:
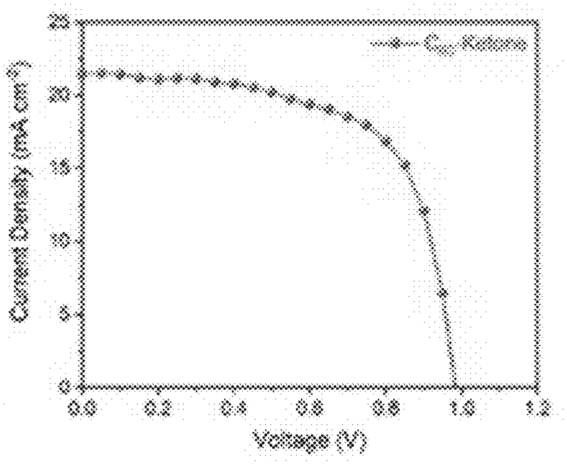
Figure 7C:
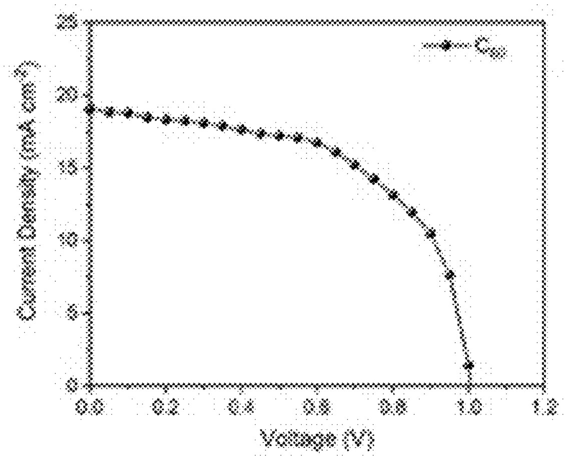

FIGS. 7(*a*), 7(*b*), and 7(*c*) show examples of organic solar cells. FIG. 7(*a*) shows a structure of an organic solar cell according to an example. A fullerene derivative of formula (2a) was vacuum-deposited as an electron transport layer on an ITO electrode, and a film of methyl ammonium lead iodide ($MAPbI_3$) as a perovskite compound was formed thereon. Further, a film of spiro-OMeTAD was formed as a hole transport layer, and an Au electrode was formed to prepare an organic solar cell. In addition, as a comparative example, an organic solar cell in which $C_{60}$ was vacuum-deposited as an electron transport layer was prepared. FIG. 7(*b*) shows output characteristics of the organic solar cell of the example, and FIG. 7(*c*) shows output characteristics of the organic solar cell of the comparative example. Table 1 shows values of open circuit voltage $V_{OC}$, short circuit current density $J_{SC}$, shape factor FF, and energy conversion efficiency PCE of the organic solar cells of the example and the comparative example. The energy conversion efficiency of the organic solar cell of the example was 13.5%, which was higher than 10.5% of that of the comparative example.

TABLE 1

| | ELECTRON TRANSPORT LAYER | $V_{OC}$ (V) | $J_{SC}$ (mA $cm^{-2}$) | FF | PCE (%) |
|---|---|---|---|---|---|
| EXAMPLE | 2a | 0.98 | 21.4 | 0.64 | 13.5 |
| COMPARATIVE EXAMPLE | $C_{60}$ | 1.00 | 19.4 | 0.54 | 10.5 |

The present disclosure has been described above based on the examples. It is to be understood by those skilled in the art that the examples are an exemplification, various modifications can be made to the combination of each component and each processing process, and such modifications are also within the scope of the present disclosure.

INDUSTRIAL APPLICABILITY

The present disclosure is applicable to a fullerene derivative, a method for producing a fullerene derivative, a deposit containing a fullerene derivative, a film, and an electronic device.

REFERENCE SIGNS LIST

1 organic solar cell, 2 cathode, 3 electron transport material layer, 4 electron acceptor/electron donor layer, 5 hole transport material layer, 6 anode, 7 cathode terminal, 8 anode terminal

The invention claimed is:

1. A fullerene derivative having a structure of formula (2e):

(2e)

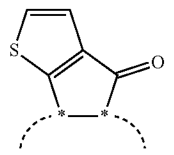

wherein * is a carbon atom at the point of attachment to a fullerene core.

2. A method for producing a deposit, comprising a step of heating the fullerene derivative according to claim 1 to a temperature equal to or higher than sublimation temperature to deposit the fullerene derivative.

3. A film comprising the fullerene derivative according to claim 1.

4. An electron acceptor comprising the fullerene derivative according to claim 1.

5. An electron transport material comprising the fullerene derivative according to claim 1.

* * * * *